US012376385B2

(12) United States Patent
Nath et al.

(10) Patent No.: US 12,376,385 B2
(45) Date of Patent: Jul. 29, 2025

(54) INTEGRATED CIRCUIT STRUCTURES WITH CONDUCTIVE PATHWAY THROUGH RESISTIVE SEMICONDUCTOR MATERIAL

(71) Applicant: GlobalFoundries U.S. Inc., Malta, NY (US)

(72) Inventors: Anindya Nath, Essex Junction, VT (US); Rajendran Krishnasamy, Essex Junction, VT (US); Robert J. Gauthier, Jr., Williston, VT (US)

(73) Assignee: GlobalFoundries U.S. Inc., Malta, NY (US)

(*) Notice: Subject to any disclaimer, the term of this patent is extended or adjusted under 35 U.S.C. 154(b) by 530 days.

(21) Appl. No.: 17/805,697

(22) Filed: Jun. 7, 2022

(65) Prior Publication Data

US 2023/0395590 A1 Dec. 7, 2023

(51) Int. Cl.
*H10D 89/60* (2025.01)
*H10D 84/60* (2025.01)

(52) U.S. Cl.
CPC ......... *H10D 89/713* (2025.01); *H10D 84/611* (2025.01); *H10D 84/619* (2025.01); *H10D 89/60* (2025.01)

(58) Field of Classification Search
CPC ............... H01L 27/0262; H01L 27/075; H01L 27/0248; H01L 27/0783; H10D 84/125; H10D 84/611–615; H10D 84/619
See application file for complete search history.

(56) References Cited

U.S. PATENT DOCUMENTS 5,240,867 A * 8/1993 Suzuki ................ H10D 62/115 438/340
6,175,394 B1 1/2001 Wu et al.
7,632,725 B2 12/2009 Ker et al.
7,746,611 B2 6/2010 Hammerschmidt
9,202,760 B2 12/2015 Domanski
11,189,701 B1 * 11/2021 Reznicek ............ H10D 64/231
2003/0116777 A1 6/2003 Yu
2006/0044719 A1 3/2006 Chen et al.
2010/0001351 A1 1/2010 Zhang et al.
2011/0042716 A1 2/2011 Lai et al.
(Continued)

FOREIGN PATENT DOCUMENTS

DE 102006037500 B3 4/2008
TW 200701427 A 1/2007

*Primary Examiner* — Steven B Gauthier
*Assistant Examiner* — Alvin L Lee
(74) *Attorney, Agent, or Firm* — Francois Pagette; Hoffman Warnick LLC

(57) ABSTRACT

An integrated circuit (IC) structure with a conductive pathway through resistive semiconductor material, e.g., for bipolar transistors, is provided. The IC structure may include a resistive semiconductor material having a first end coupled to a first doped semiconductor material. The first doped semiconductor material has a first doping type. A doped well may be coupled to a second end of the resistive semiconductor material. The doped well has a second doping type opposite the first doping type. A second doped semiconductor material is coupled to the doped well and has the first doping type. The resistive semiconductor material is within a conductive pathway from the first doped semiconductor material to the second doped semiconductor material.

19 Claims, 6 Drawing Sheets

(56) References Cited

U.S. PATENT DOCUMENTS

2012/0205780 A1* 8/2012 Berglund ............. H10D 84/125 257/E27.03
2013/0242659 A1 9/2013 Yu et al.
2013/0307017 A1 11/2013 Chen
2014/0015052 A1* 1/2014 Fenouillet-Beranger .................... H01L 27/1203 257/348
2014/0361367 A1 12/2014 Tseng et al.
2020/0411504 A1 12/2020 Mitra et al.
2022/0190116 A1 6/2022 Dutta et al.
2022/0246632 A1 8/2022 Shimane
2023/0369314 A1* 11/2023 Gauthier, Jr. ....... H01L 27/0266

* cited by examiner

INTEGRATED CIRCUIT STRUCTURES WITH CONDUCTIVE PATHWAY THROUGH RESISTIVE SEMICONDUCTOR MATERIAL

BACKGROUND

1. Technical Field

The present disclosure provides integrated circuit structures with a conductive pathway through a resistive semiconductor material, and various structures including such a conductive pathway.

2. Background Art

Present technology is at atomic level scaling of certain micro-devices such as logic gates, bipolar transistors, field effect transistors (FETs), and capacitors. Circuit chips with millions of such devices are common. Some devices for routing excess current away from sensitive components, e.g., electrostatic discharge devices (ESDs), are designed to be electrically active only in specific operating circumstances. That is, ESDs and similar devices must not trigger at too low a voltage to operate in safe situations, or at too high a voltage to operate in unsafe situations. Some ESDs or similar devices may have less than desired voltage scaling or significant current leakage when they include two or more bipolar transistors or interconnected diodes in proximity (e.g., those connected in a Darlington pair).

SUMMARY

The illustrative aspects of the present disclosure are designed to solve the problems herein described and/or other problems not discussed.

Embodiments of the disclosure provide an integrated circuit (IC) structure, including: a resistive semiconductor material having a first end coupled to a first doped semiconductor material, the first doped semiconductor material having a first doping type; a doped well coupled to a second end of the resistive semiconductor material, the doped well having a second doping type opposite the first doping type; and a second doped semiconductor material coupled to the doped well and having the first doping type, wherein the resistive semiconductor material is within a conductive pathway from the first doped semiconductor material to the second doped semiconductor material.

Further embodiments of the disclosure provide an integrated circuit (IC) structure, including: a shallow well within a first portion of a deep well, wherein the deep well has a first doping type and the shallow well has a second doping type opposite the first doping type; a resistive semiconductor material within the deep well and adjacent the shallow well; a first doped semiconductor material on the resistive semiconductor material and having the first doping type; and a second doped semiconductor material on the shallow well and having the first doping type, wherein the resistive semiconductor material is within a conductive pathway from the first doped semiconductor material to the second doped semiconductor material.

Additional embodiments of the disclosure provide an integrated circuit (IC) structure, including: a first resistive semiconductor material on a substrate; a first doped semiconductor material on the first resistive semiconductor material, the first doped semiconductor material having a first doping type; a doped well within the substrate and having a first end adjacent the first resistive semiconductor material, the doped well having a second doping type opposite the first doping type; a second doped semiconductor material on a first portion of the doped well and having the first doping type, wherein the first resistive semiconductor material is within a conductive pathway from the first doped semiconductor material to the second doped semiconductor material; and a base semiconductor material on a second portion of the doped well and having the second doping type.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
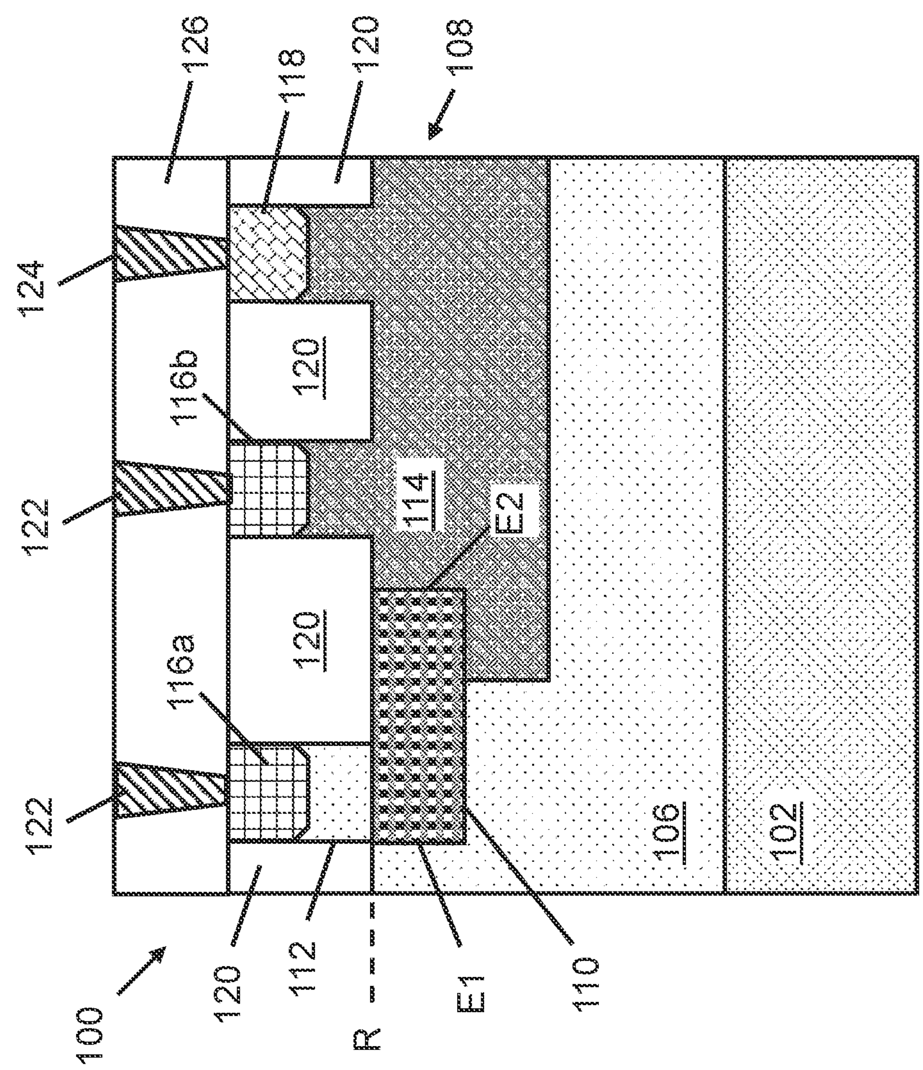
FIG. 1 depicts a cross-sectional view of an integrated circuit (IC) structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described to best explain the principles of the disclosure and the practical application, and to enable others of ordinary skill in the art to understand the disclosure for various embodiments with various modifications as are suited to the particular use contemplated.

Embodiments of the disclosure provide an integrated circuit (IC) structure in which a resistive semiconductor material defines a portion of a conductive pathway between two doped semiconductor materials, e.g., the emitter and collector terminals of a bipolar transistor. Embodiments of the disclosure are particularly suitable for use in devices that interconnect two or more bipolar transistors, and hence have sensitive triggering voltages or currents. The IC structure may have a resistive semiconductor material with a first end coupled to a first doped semiconductor material. The first doped semiconductor material has a first doping type (i.e., p-type or n-type doping). A doped well within a portion of a substrate may be coupled to a second end of the resistive semiconductor material. The doped well has a second doping type opposite the first doping type (i.e., n-type when the first doped semiconductor material is p-type or vice versa). A second doped semiconductor material is coupled to the doped well and has the first doping type. The resistive semiconductor material is within, and hence defines part of, a conductive pathway from the first doped semiconductor material to the second doped semiconductor material.

IC structures according to the disclosure may be structurally integrated into one or more bipolar junction transistors (BJTs). BJTs, such as those in embodiments of the current disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials.

Referring to FIG. 1, an integrated circuit (IC) structure (simply "structure" hereafter) 100, according to embodiments of the disclosure, is shown. Structure 100 is formed on a substrate 102 including, e.g., one or more semiconductor materials. Substrate 102 may include but is not limited to silicon, germanium, silicon germanium (SiGe), silicon carbide, or any other common integrated circuit (IC) semiconductor substrates. In the case of SiGe, the germanium concentration in substrate 102 may differ from other SiGe-based structures described herein. A portion or entirety of substrate 102 may be strained.

Various conductive particles ("dopants") may be introduced into semiconductor material(s) of substrate 102, e.g., to define a deep well 106 therein. A "dopant" refers to an element introduced into semiconductor to establish either p-type (acceptors) or n-type (donors) conductivity. In the case of a silicon substrate, common dopants may include, e.g., boron (B), and/or indium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (e.g., a film of photoresist material and/or other component to block dopants) in place so that only certain areas of the substrate will be doped. In the example of doping by implantation, an ion implanter may be employed. In further examples, in-situ doping or other doping techniques may be used.

In doping processes, a doping type, a dopant species, a dosage, and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/$cm^2$, and an energy of about 40 to 80 keV to produce a doping level of between 1E17 and 1E18 atoms/$cm^3$.

Doped portions of a substrate may be known in the art as a "well." A well commonly refers to the implanted/diffused region in semiconductor wafer needed to implement a complementary metal oxide semiconductor (CMOS) cell. A "deep well" refers to doped semiconductor material located underneath active device components and/or other wells. A "shallow well," similar to a deep well, is an area of doped semiconductor material located beneath active device components but not to the same depth as a deep well. Hence, it is possible for a highly doped active semiconductor material to be located inside of a shallow well or deep well, and/or for the shallow well in turn to be located inside of a deep well. Additional levels of wells may be provided in further device structures, e.g., to produce a "triple well" stack of doped semiconductor materials and/or more complex arrangements of layers having distinct doping polarities and/or types. Depending on the attributes of a device to be manufactured, portions of semiconductor material on or over substrate 102 may be either n-type or p-type doped as discussed herein. Deep well 106 may have a predetermined polarity (e.g., p-type doping). Deep well 106 initially may be formed within an entire thickness of substrate 102, but this is not necessarily required.

Structure 100 may include, e.g., a shallow well 108 within deep well 106. Shallow well 108 may have an opposite doping type from deep well 106, e.g., shallow well 108 may be n-type doped in the case where deep well 106 is doped p-type. Shallow well 108 may have less vertical depth than deep well 106, such that deep well 106 is horizontally adjacent and below shallow well 108. Structure 100 also may include a resistive semiconductor material 110 on or within deep well 106, e.g., by implanting argon (Ar) and/or other dopants to convert a portion of semiconductor material within substrate 102 into a higher-resistive material such as amorphous semiconductor (e.g., amorphous silicon (a-Si)) or polycrystalline semiconductor (e.g., polycrystalline silicon (poly-Si)). In some contexts, resistive semiconductor material 110 may include and/or may be referred to as a "trap-rich" material. Resistive semiconductor material 110, notably, is of higher electrical resistivity than deep well 106, shallow well 108, and/or other doped semiconductor materials herein. Resistive semiconductor material 110 nevertheless enables passage of charge carriers therethrough, e.g., such that portions of a conductive pathway for electricity may include resistive semiconductor material 110.

Resistive semiconductor material 110 may extend horizontally alongside shallow well 108, and optionally into a portion thereof. Thus, resistive semiconductor material 110 may include a first end E1 adjacent and/or abutting deep well 106 and a second end E2 abutting shallow well 108. Ends E1, E2 of resistive semiconductor material 110 may be at opposite horizontal ends of resistive semiconductor material 110, but this is not necessarily required in all implementations (e.g., where resistive semiconductor material 110 has a non-rectangular cross-section). In some cases, an upper surface of resistive semiconductor material 110 may have an upper surface that is substantially coplanar with an upper surface of shallow well 108, e.g., along line R as shown. The upper surface(s) of shallow well 108 that have coplanarity with the upper surface of resistive semiconductor material 110 along line R may not necessarily be an uppermost surface of shallow well 108 and may be underneath trench isolation(s) 120 as discussed elsewhere herein.

Resistive semiconductor material 110 may be coupled to a first doped semiconductor material 112 at first end E1, e.g., by first end E1 being located underneath first doped semiconductor material 112, and/or by other structural arrangements such as first doped semiconductor material 112 being adjacent first doped semiconductor material 112. Second end E2 of resistive semiconductor material 110 may be coupled to a second doped semiconductor material 114, e.g., shallow well 108 and/or portions of more highly doped semiconductor therein. Doped semiconductor materials 112, 114 may be doped, based on the intended polarity and/or intended characteristics of device structures formed thereon. According to an example, first doped semiconductor material 112 may be doped n-type whereas second doped semiconductor material 114 may be doped p-type. A set of emitter/collector (E/C) terminals 116*a*, 116*b* may be on materials 112, 114 at respective positions, e.g., such that a first E/C material 116*a* may be coupled to first doped semiconductor material 112 and a second E/C material 116*b* may be coupled to second doped semiconductor material 114. In the configuration shown, E/C terminal 116*a* acts as a collector and E/C terminal 116*b* acts as an emitter. Structure 100 additionally may include a base material 118 on shallow well 108. Base material 118 may be of the same doping type as shallow well 108 (e.g., they both may be doped n-type), but base material 118 may have a higher doping concentration than shallow well 108. By applying an electrical current to base material 118, an operator of structure 100 can enable or disable current flow from one E/C material 116*a*, 116*b* to another through materials 112, 114 and resistive semiconductor material 110 therebetween.

A set of trench isolations (TIs) 120 may physically and electrically isolate respective portions of E/C materials 116*a*, 116*b* and base material 118, e.g., by being located horizontally therebetween. TI(s) 120 may be formed by forming trenches (not shown) within deep well 106 and/or shallow well 108 of substrate 102 and filling such trenches with an insulating material such as oxide, to isolate various materials from another. TI(s) 120 may include, e.g., various oxide and/or nitride insulators and/or other currently known or later developed dielectrics. The depth of TI(s) 120 may be chosen, e.g., to influence the threshold current to enable current flow between E/C materials 116*a*, 116*b* and/or other electrical properties. In some implementations, a lower surface of TI(s) 120 may be on upper surfaces of shallow well 108 and/or resistive semiconductor material 110, i.e., their interface may define a boundary along line R. According to one example, four TIs 120 are formed in structure 100 as shown, but more or fewer TIs 120 may be formed in various embodiments discussed herein.

One or more E/C contacts 122 and/or base contacts 124 conductively connecting structure 100 to various overlying circuit elements may be formed within predetermined portions of an insulator layer 126 by a controlled amount of vertical etching to form openings to one or more contact sites, and then filling the openings with a conductor. Each contact 122, 124 may include any currently known or later developed conductive material configured for use in an electrical contact, e.g., copper (Cu), aluminum (Al), etc. Each contact 122, 124 may include the same or similar materials, but also may be identified separately based on the material(s) to which they connect. For instance, E/C contacts 122 may be coupled to emitter and collector terminals defined within structure 100, whereas base contact 124 may be coupled to one or more base materials defined within structure 100.

Contacts 122, 124 may additionally include refractory metal liners (not shown) positioned alongside insulator layer 126 to prevent electromigration degradation, shorting to other components, etc. Additionally, selected portions of E/C material(s) 116*a*, 116*b* and/or base material 118 may include silicide regions (i.e., portions of semiconductor that are annealed in the presence of an overlying conductor to increase the electrical conductivity of semiconductor regions) at their physical interface with contact(s) 122, 124 where applicable.

Figure 2:
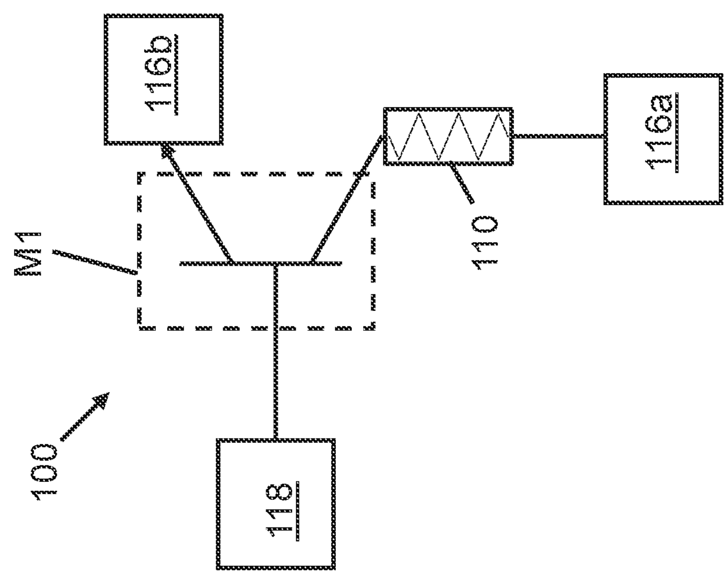
FIG. 2 depicts a schematic diagram of an IC structure according to embodiments of the disclosure.

Referring to FIGS. 1 and 2 together, in which FIG. 2 provides a schematic diagram of a circuit implemented through structure 100, further attributes of the disclosure are discussed. As shown in FIG. 2, structure 100 can be modeled as a bipolar transistor M1 in which E/C materials 116*a*, 116*b* provide emitter and collector terminals, respectively, base material 118 provides a base terminal, and resistive semiconductor material 110 acts as a resistor embedded within the pathway from emitter to base. Resistive semiconductor material 110 thus does not prevent charge carriers from passing from one E/C material 116*a*, 116*b* to another, but induces a voltage drop from emitter to collector based on the size and composition of resistive semiconductor material 110. This circuit configuration may provide technical benefits in a variety of situations, e.g., electrostatic discharge devices (ESDs) and/or other devices having multiple interconnected bipolar transistors as discussed herein.

Figure 3:
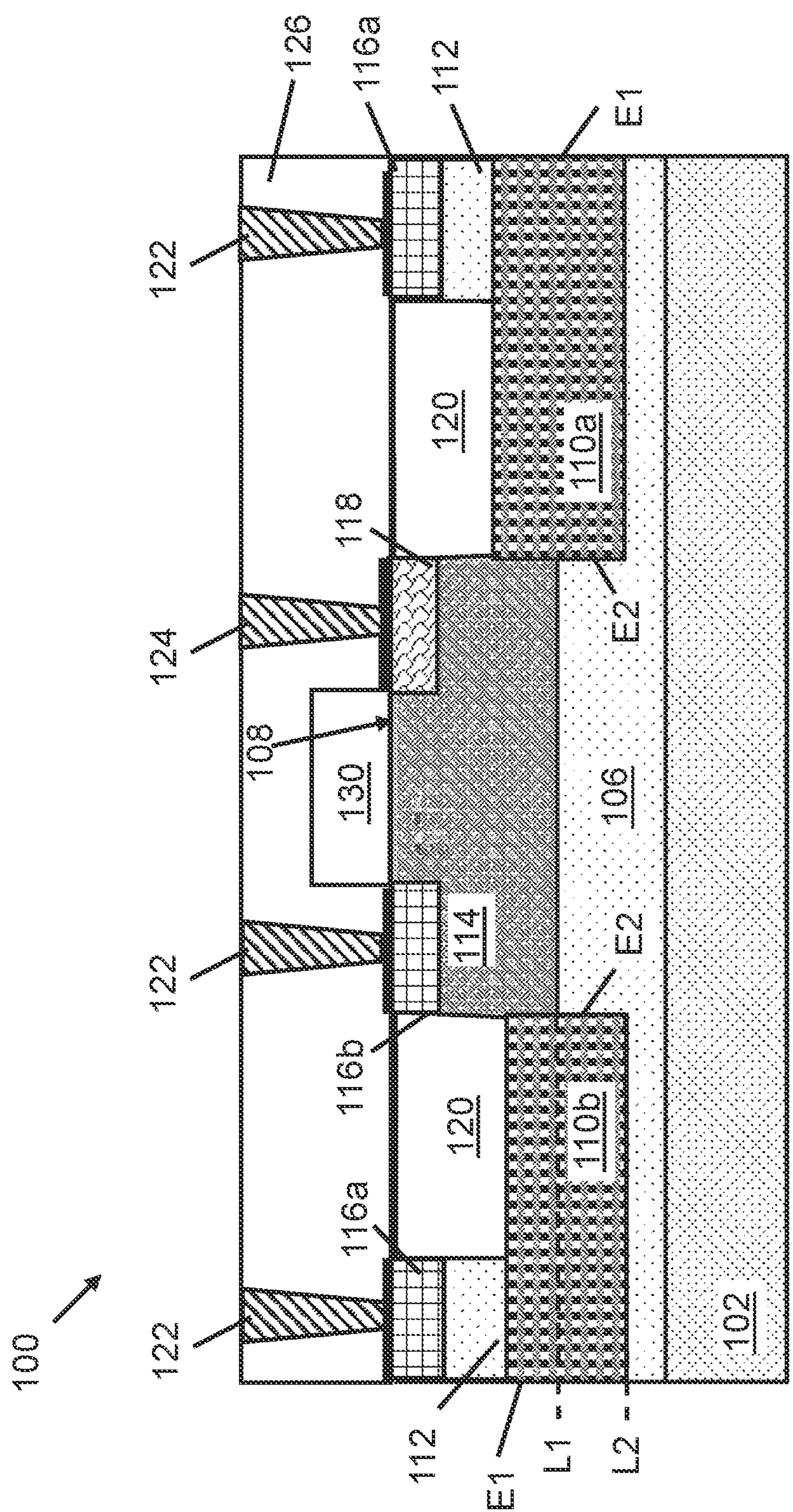
FIG. 3 depicts a cross-sectional view of an IC structure according to further embodiments of the disclosure.

Referring to FIG. 3, further implementations of structure 100 may include, e.g., multiple emitter or collector terminals and/or other arrangements of semiconductor material over substrate 102. As with other embodiments discussed herein, structure 100 may include shallow well 108 within deep well 106. One resistive semiconductor material 110*a* may have a first end E1 coupled to one first semiconductor material 112 and a second end E2 coupled to shallow well 108. In addition, structure 100 may include another resistive semiconductor material 110*b* having its own first end E1 coupled to another first semiconductor material 112 and a second end E2 coupled to shallow well 108. Thus, shallow well may be coupled to multiple first semiconductor materials, each through a respective resistive semiconductor material 110.

In this arrangement, structure 100 may include a pair of resistive semiconductor materials 110*a*, 110*b*, each resistive semiconductor material 110 being adjacent a respective horizontal end of shallow well 108. Additionally, each first semiconductor material may be coupled to a corresponding resistive semiconductor material 110, e.g., by being positioned on or adjacent first end E1 thereof. Similar to other embodiments discussed herein, first E/C material(s) 116*a* may be on first semiconductor material 112, with E/C contacts 122 being located thereover. Regardless of how many resistive semiconductor materials 110, first semiconductor materials 112, etc., are included, portions of shallow well 108 may include or define a second semiconductor material 114 coupling resistive semiconductor material(s) 110 to second E/C material 116*b* and base material 118. Second E/C material 116*b* may be coupled to E/C contact(s) 122 thereto and base material 118 may be coupled to base contact(s) 124 thereto as discussed with respect to other embodiments.

Structure 100 may include additional features for ease of integration with other devices and/or circuit structures. For example, portions of a gate structure 130 may be on shallow well 108 and horizontally between second E/C material 116*b* and base material 118. Gate structure 130 may extend laterally into and/or out of the plane of the page, e.g., such that it may be located over active semiconductor material of a complementary metal oxide semiconductor (CMOS) device and/or other structure on substrate 102. Gate structure 130, by extending over shallow well 108, may prevent silicide materials, contacts, and/or other structures from being formed on shallow well 108 in the space between second E/C material 116*b* and base material 118. Shallow well 108, optionally, may have a lower surface L1 that is further above non-doped portions of substrate 102 than a lower surface L2 of resistive semiconductor material(s) 110 to which it connects. The difference in position between lower surfaces L1, L2 in structure 100 may allow resistive semiconductor material(s) 110 to have a relatively wide vertical thickness while permitting TI(s) 120 to be formed thereon without increasing the physical contact between shallow well 108 and resistive semiconductor material(s) 110.

Figure 4:
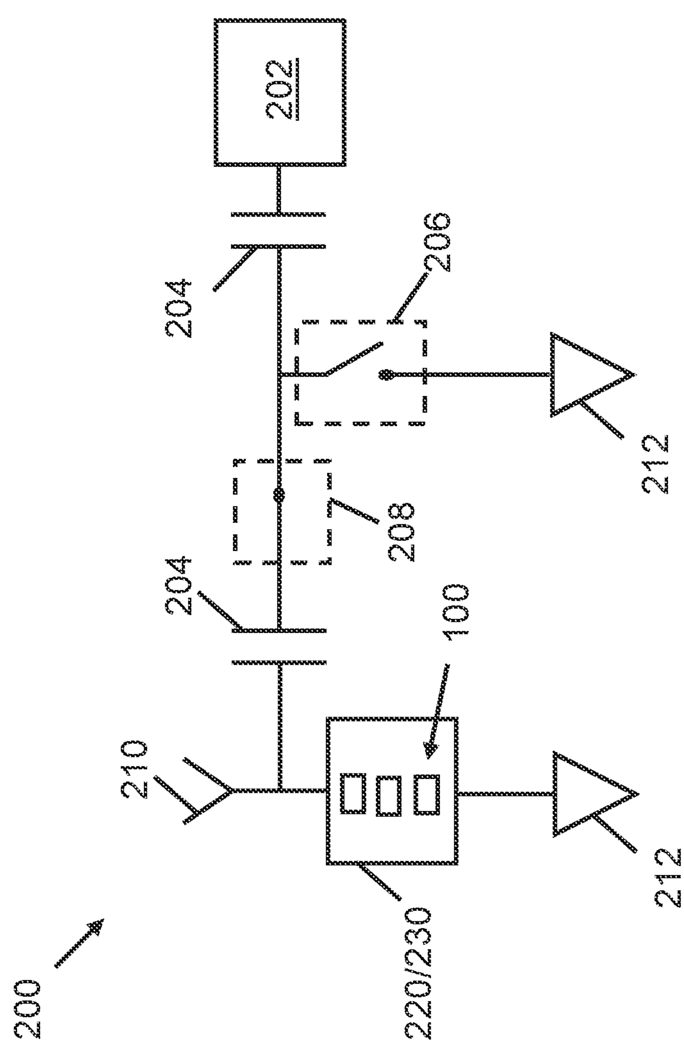
FIG. 4 depicts an example current bypass circuit incorporating an IC structure according to embodiments of the disclosure.

Turning to FIG. 4, embodiments of structure 100 may be implemented in a device 200 (e.g., an amplifier circuit as discussed herein) to route unsafe currents away from sensitive components, e.g., in the event of a radiation strike or other electrostatic discharge event. Device 200 may include a circuit 202 (e.g., a power amplifier (PA), low noise amplifier (LNA)) or other electric circuit implementing functions such as logic, memory, signal processing, signal amplification, etc. A set of capacitive couplings 204 may couple a portion of circuit 202 to a radio frequency (RF) switch 206. RF switch 206 can selectively enable or disable current flow to circuit 202, e.g., current will bypass circuit 202 when RF switch 206 is closed and will flow to circuit 202 when RF switch 206 is open. Device 200 also may include an ESD switch 208 for enabling or disabling current flow to circuit 202, e.g., in the event of an electrostatic discharge (ESD) event. An ESD structure 220 (or silicon controlled rectifier (SCR) 230, discussed elsewhere herein), including one or more implementations of structure 100, may be within device 200 and may be electrically in parallel with circuit 202 and coupled to circuit 202 through capacitive couplings 204. An input node 210 may couple a power supply and/or other external circuitry, devices, etc., to ESD structure 220 to circuit 202 through capacitive couplings 204, and/or may be directly coupled to structure 100.

Figure 5:
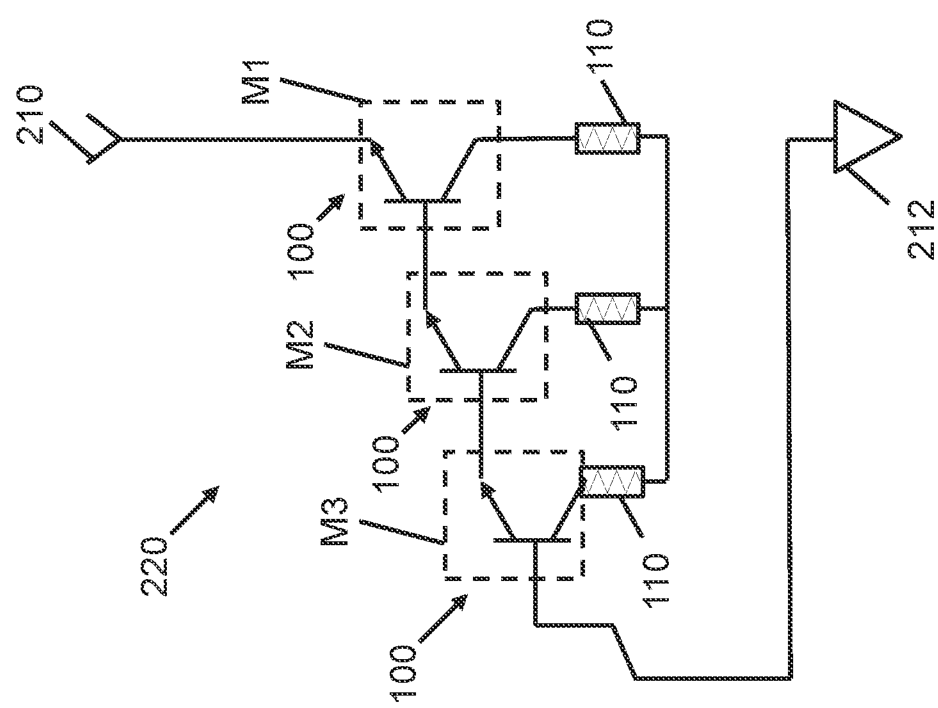
FIG. 5 depicts a schematic diagram of an electrostatic discharge (ESD) structure with a set of string diodes according to embodiments of the disclosure.

FIG. 5 depicts an example diagram of ESD structure 220 including, e.g., multiple serially coupled structures 100 each having a base terminal coupled to an emitter terminal of another structure 100, and/or an emitter terminal coupled to a base terminal of another structure. Each structure 100 may define or include a respective bipolar transistor (separately labeled M1, M2, M3 in FIG. 5) within ESD structure 220. Each bipolar transistor M1, M2, M3 may be interconnected at a shared node through resistive semiconductor material(s) 110 therein.

The serial coupling of bipolar transistors M1, M2, M3 in ESD structure 220 may define a "string diode" structure, e.g., a coupling from one terminal to another that creates an open circuit at less than a threshold circuit and converts into a conductive pathway in response to the threshold current. Each transistor M1, M2, M3 in EST structure 220 may include an implementation of structure 100. The threshold current may correspond to an electrostatic discharge event. The presence of resistive semiconductor material(s) 110 in ESD structure 220 may increase the threshold current to a value that is higher than if resistive semiconductor material(s) 110 is/are not included. Bipolar transistors M1, M2, M3 also may counteract unintended current leakage and/or reductions in voltage scaling that would otherwise result from providing serially coupled bipolar transistors in ESD structure 220.

Figure 6:
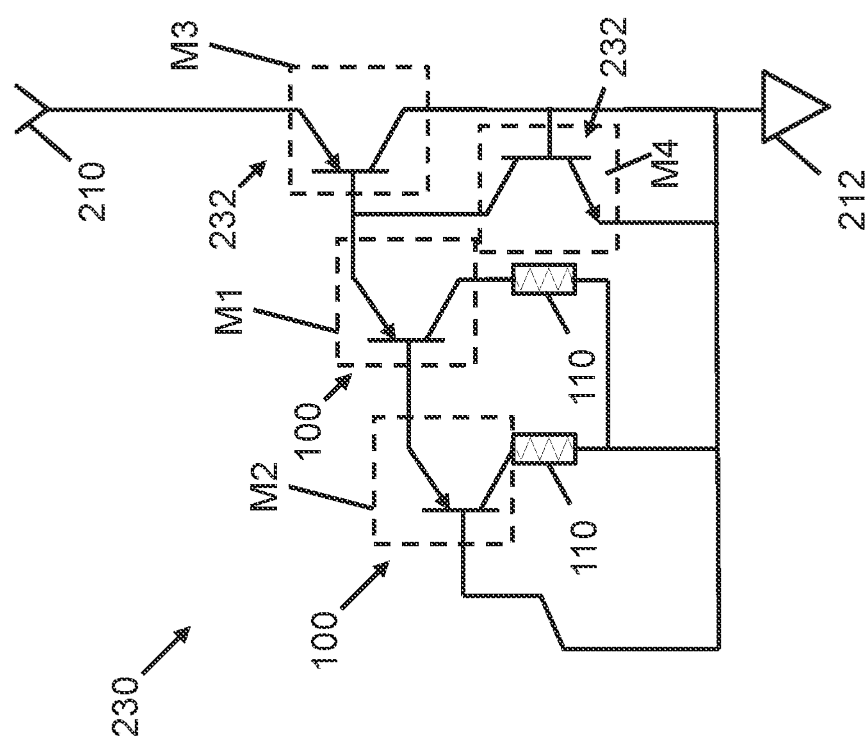
FIG. 6 depicts a schematic diagram of an ESD structure with a silicon controlled rectifier (SCR) according to embodiments of the disclosure.

FIG. 6 depicts another form of ESD circuitry in the form of a silicon controlled rectifier (SCR) 230 having multiple structures 100 therein according to embodiments of the disclosure. SCR 230 may operate on principles similar to ESD structure(s) 220 (FIG. 5) and may be formed on substrate 102 by interconnecting multiple structures 100, and one or more additional bipolar transistors 232 (separately identified as M3, M4), e.g., according to the illustrative arrangement of FIG. 6. SCR 230 may be particularly effective for use as a "snapback device" (i.e., a device capable of reverting to a non-conductive state from a conductive state after the electrostatic discharge event ends) due to its ease of integration into semiconductor material(s) having other structures/devices formed therein.

In this configuration, additional bipolar transistors 232 may be interconnected from collector to emitter to define four regions of alternating polarity (e.g., n-p-n-p) therein. Additional bipolar transistors 232 optionally may lack resistive semiconductor regions 110 therein, whereas structures 100 may include resistive semiconductor material(s) 110 between their base terminal and one E/C terminal as discussed herein. In SCR 232, applying at least a trigger current to the base terminal of transistor M4 can enable excessive current from an electrostatic discharge event to flow through SCR 232 thereof and hence bypass other components (e.g., circuit 202 (FIG. 4)) that are sensitive to high currents. The current(s) transmitted to SCR 232 may be required to pass through a pair of transistors M1, M2 having resistive semiconductor material 110 therein, and thus the current sensitivity of transistors M1, M2 may be less than SCR structures 232 which lack resistive semiconductor material 110 in one or more transistors. Due to the reduced bipolar gain in the presence of resistive semiconductor material 110 in the triggering diodes, the turn on voltage of SSCR 232 may scale linearly with the number of diodes, leading to reduced amount of leakage. Embodiments of the disclosure thus may reduce operational and/or surface area penalties that otherwise may be incurred from including ESD protective structures in device 200.

In addition to the various types of devices 200 discussed herein (e.g., ESD structure 220, SCR 230), structure 100 additionally or alternatively may be incorporated into other structures including, e.g., bidirectional thyristors or other thyristor-based protective devices (TSPDs), gas discharge tubes (GDTs), bipolar transistors having avalanche junctions, and/or other electrical elements having similar properties.

Embodiments of the disclosure provide various technical and commercial advantages, examples of which are discussed herein. Applicants have determined that embedding resistive semiconductor material(s) 110 in a conductive pathway to an emitter or collector within structures 100 (e.g., those implemented as a bipolar transistor) may reduce leakage current(s) within structure 100. When interconnecting several bipolar transistors having resistive semiconductor material(s) 110 therein, devices 200 implementing such transistors will exhibit more linear voltage scaling between any input nodes 210 and output nodes 212 to/from device 200. Resistive semiconductor material(s) 110 may be incorporated into structure 100 without using additional masks and/or process changes, e.g., simply by modifying the conductivity of existing semiconductor material when deep well(s) 106 and shallow well(s) 108 are formed within substrate 102.

The method and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
- a resistive semiconductor material including polycrystalline silicon (poly-Si) having a first end coupled to a first doped semiconductor material, the first doped semiconductor material having a first doping type;
- a doped well coupled to a second end of the resistive semiconductor material, the doped well having a second doping type opposite the first doping type; and
- a second doped semiconductor material coupled to the doped well and having the first doping type, wherein the resistive semiconductor material is within a conductive pathway from the first doped semiconductor material to the second doped semiconductor material.

2. The IC structure of claim 1, wherein the resistive semiconductor material and the doped well are within a deep well having the first doping type.

3. The IC structure of claim 1, further comprising:
- a first emitter/collector (E/C) contact coupled to the resistive semiconductor material through the first doped semiconductor material;
- a base contact coupled to the doped well; and
- a second E/C contact coupled to the second doped semiconductor material.

4. The IC structure of claim 3, wherein the first E/C contact is coupled to a first E/C terminal of a bipolar transistor including:
- an additional resistive semiconductor material having a first end coupled to the first E/C terminal, the first E/C terminal having the first doping type;
- an additional doped well coupled to a second end of the additional resistive semiconductor material, the additional doped well having the second doping type; and
- a second E/C terminal coupled to the additional doped well and having the first doping type, wherein the additional resistive semiconductor material is within a conductive pathway from the first E/C terminal to the second E/C terminal, and wherein the second E/C terminal is coupled to the base contact.

5. The IC structure of claim 4, wherein the second E/C contact is coupled to a doped well of a silicon controlled rectifier (SCR).

6. The IC structure of claim 1, further comprising a trench isolation (TI) on the resistive semiconductor material and horizontally between the first doped semiconductor material and the second doped semiconductor material.

7. An integrated circuit (IC) structure, comprising:
- a shallow well within a first portion of a deep well, wherein the deep well has a first doping type and the shallow well has a second doping type opposite the first doping type;
- a resistive semiconductor material within the deep well and adjacent the shallow well;
- a first doped semiconductor material on the resistive semiconductor material and having the first doping type; and
- a second doped semiconductor material on the shallow well and having the first doping type, wherein the resistive semiconductor material is within a conductive pathway from the first doped semiconductor material to the second doped semiconductor material, wherein the shallow well, the first doped semiconductor material, and the second doped semiconductor material define respective terminals of a vertical bipolar transistor.

8. The IC structure of claim 7, further comprising:
a first emitter/collector (E/C) contact coupled to the first doped semiconductor material;
a base contact coupled to the shallow well; and
a second E/C contact coupled to the second doped semiconductor material.

9. The IC structure of claim 8, wherein the first E/C contact is coupled to a first E/C terminal of an additional bipolar transistor including:
an additional resistive semiconductor material having a first end coupled to the first E/C terminal, the first E/C terminal having the first doping type;
a doped well coupled to a second end of the additional resistive semiconductor material, the doped well having the second doping type; and
a second E/C terminal coupled to the doped well and having the first doping type, wherein the additional resistive semiconductor material is within a conductive pathway from the first E/C terminal to the second E/C terminal, and wherein the second E/C terminal is coupled to the base contact.

10. The IC structure of claim 9, wherein the second E/C contact is coupled to a base terminal of a silicon controlled rectifier (SCR).

11. The IC structure of claim 7, wherein an upper surface of the shallow well is substantially coplanar with an upper surface of the resistive semiconductor material.

12. The IC structure of claim 11, further comprising a trench isolation (TI) on the upper surface of the shallow well and the upper surface of the resistive semiconductor material, wherein the TI is horizontally between the first doped semiconductor material and the second doped semiconductor material.

13. The IC structure of claim 7, wherein the resistive semiconductor material includes polycrystalline silicon (poly-Si).

14. An integrated circuit (IC) structure, comprising:
a first resistive semiconductor material on a substrate;
a first doped semiconductor material on the first resistive semiconductor material, the first doped semiconductor material having a first doping type;
a doped well within the substrate and having a first end adjacent the first resistive semiconductor material, the doped well having a second doping type opposite the first doping type;
a second doped semiconductor material on a first portion of the doped well and having the first doping type, wherein the first resistive semiconductor material is within a conductive pathway from the first doped semiconductor material to the second doped semiconductor material; and
a base material on a second portion of the doped well and including a semiconductor having the second doping type, wherein the base material, the first doped semiconductor material, and the second doped semiconductor material define respective terminals of a vertical bipolar transistor.

15. The IC structure of claim 14, further comprising:
a second resistive semiconductor material on the substrate; and
a second doped semiconductor material on the second resistive semiconductor material, the first doped semiconductor material having the first doping type, wherein the second doped semiconductor material is adjacent a second end of the doped well.

16. The IC structure of claim 14, further comprising:
a first emitter/collector (E/C) contact coupled to the first doped semiconductor material;
a second E/C contact coupled to the second doped semiconductor material; and
a base contact coupled to the base material.

17. The IC structure of claim 16, wherein the first E/C contact is coupled to a first E/C terminal of an additional bipolar transistor including:
an additional resistive semiconductor material having a first end coupled to the first E/C terminal, the first E/C terminal having the first doping type;
an additional doped well coupled to a second end of the additional resistive semiconductor material, the additional doped well having the second doping type; and
a second E/C terminal coupled to the additional doped well and having the first doping type, wherein the additional resistive semiconductor material is within a conductive pathway from the first E/C terminal to the second E/C terminal, and wherein the second E/C terminal is coupled to the base contact.

18. The IC structure of claim 17, wherein the second E/C contact is coupled to a base terminal of a silicon controlled rectifier (SCR).

19. The IC structure of claim 14, wherein the first resistive semiconductor material includes polycrystalline silicon (poly-Si).

* * * * *